US 7,800,128 B2

(12) United States Patent
Domanski et al.

(10) Patent No.: US 7,800,128 B2
(45) Date of Patent: Sep. 21, 2010

(54) SEMICONDUCTOR ESD DEVICE AND METHOD OF MAKING SAME

(75) Inventors: Krzysztof Domanski, Munich (DE); Cornelius Christian Russ, Diedorf (DE); Kai Esmark, Neuried (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/138,208

(22) Filed: Jun. 12, 2008

(65) Prior Publication Data

US 2009/0309129 A1 Dec. 17, 2009

(51) Int. Cl.
*H01L 29/72* (2006.01)
*H01L 29/74* (2006.01)
*H01L 27/01* (2006.01)
*H01L 27/12* (2006.01)

(52) U.S. Cl. ............... 257/173; 257/174; 257/362; 257/E29.181

(58) Field of Classification Search ........... 257/173, 257/174, 362, E29.181
See application file for complete search history.

(56) References Cited

U.S. PATENT DOCUMENTS

| | | | |
|---|---|---|---|
| 5,574,618 A * | 11/1996 | Croft | 361/212 |
| 5,880,488 A * | 3/1999 | Yu | 257/111 |
| 6,055,143 A * | 4/2000 | Yu | 361/56 |
| 6,353,237 B1 * | 3/2002 | Yu | 257/173 |
| 6,768,616 B2 * | 7/2004 | Mergens et al. | 361/56 |
| 6,803,633 B2 * | 10/2004 | Mergens et al. | 257/358 |
| 7,589,944 B2 * | 9/2009 | Mergens et al. | 361/56 |
| 2002/0041007 A1 * | 4/2002 | Russ | 257/546 |
| 2004/0164356 A1 * | 8/2004 | Mergens et al. | 257/360 |
| 2006/0011939 A1 | 1/2006 | Mohn et al. | |
| 2007/0002508 A1 * | 1/2007 | Vanysacker et al. | 361/56 |
| 2007/0058307 A1 * | 3/2007 | Mergens et al. | 361/56 |

OTHER PUBLICATIONS

Pogany, D., et al., "Moving Current Filaments in ESD Protection Devices and Their Relation to Electrical Characters," Institute for Solid State Electronics TU, Vienna, Austria, 8 pages.
Litzenberger, M., et al., "Scanning Heterodyne Interferometer Setup for the Time-Resolved Thermal and Free-Carrier Mapping in Semiconductor Devices," IEEE Transactions on Instrumentation and Measurement, vol. 54, No. 6, Dec. 2005, 8 pages.
Mergens, M., et al., "High Holding Current SCRs (HHI-SCR) for ESD Protection and Latch-up Immune IC Operation," Sarnoff Corporation, Princeton, NJ, 8 pages.

* cited by examiner

*Primary Examiner*—Ngan Ngo
(74) *Attorney, Agent, or Firm*—Slater & Matsil, L.L.P.

(57) ABSTRACT

A semiconductor device includes an SCR ESD device region disposed within a semiconductor body, and a plurality of first device regions of the first conductivity type disposed on a second device region of the second conductivity type, where the second conductivity type is opposite the first conductivity type. Also included is a plurality of third device regions having a sub-region of the first conductivity type and a sub-region of the second conductivity type disposed on the second device region. The first regions and second regions are distributed such that the third regions are not directly adjacent to each other. A fourth device region of the first conductivity type adjacent to the second device region and a fifth device region of the second conductivity type disposed within the fourth device region are also included.

34 Claims, 9 Drawing Sheets

SEMICONDUCTOR ESD DEVICE AND METHOD OF MAKING SAME

TECHNICAL FIELD

This invention relates generally to semiconductor devices and methods, and more particularly to an ESD protection device and method.

BACKGROUND

As electronic components are getting smaller and smaller along with the internal structures in integrated circuits, it is getting easier to either completely destroy or otherwise impair electronic components. In particular, many integrated circuits are highly susceptible to damage from the discharge of static electricity. Generally, electrostatic discharge (ESD) is the transfer of an electrostatic charge between bodies at different electrostatic potentials or voltages, caused by direct contact or induced by an electrostatic field. The discharge of static electricity, or ESD, has become a critical problem for the electronics industry.

Device failures resulting from ESD events are not always immediately catastrophic or apparent. Often, the device is only slightly weakened but is less able to withstand normal operating stresses. Such a weakened device may result in reliability problems. Therefore, various ESD protection circuits should be included in a device to protect its various components.

When an ESD pulse occurs on a transistor, the extremely high voltage of the ESD pulse can break down the transistor and can potentially cause permanent damage. Consequently, the circuits associated with the input/output pads of an integrated circuit need to be protected from ESD pulses to prevent such damage.

Integrated circuits and the geometry of the transistors that make up the integrated circuits continue to be reduced in size and the transistors are arranged closer together. A transistor's physical size limits the voltage that the transistor can withstand without being damaged. Thus, breakdown voltages of transistors are lowered and currents capable of overheating components are more frequently reached by the voltages and currents induced by an ESD event.

In order to remedy problems with lower device yields stemming from ESD events, the semiconductor industry has recommended a number of different ESD event models to be used for ESD test criteria and design goals. One of these ESD event models, the charged device model (CDM), models rapid ESD events likely to occur during the semiconductor manufacturing and handling process. The ESD events modeled by CDM represent instantaneous discharge. Such an ESD event may consist of a peak current a few Amps and may last for about 1 ns.

Designing an ESD device triggerable in less than 1 ns is challenging because most ESD devices must be designed to be physically large in order to handle high ESD currents and voltages. The large device capacitance associated with the relatively large physical size of an ESD device, however, increases the RC time constant of the ESD device, which increases the turn-on time of the ESD device. ESD device design for the CDM model, therefore entails achieving a difficult balance between device speed and current handling capability. Thus, there is a need for ESD protection devices that can be rapidly triggered, yet still conduct large currents.

SUMMARY OF THE INVENTION

In one embodiment, a semiconductor device includes an ESD device region disposed within a semiconductor body of a first conductivity type, and a plurality of first device regions of a first conductivity type disposed on a second device region of the second conductivity type, where the second conductivity type opposite the first conductivity type. Also included is a plurality of third device regions disposed on the second device region, where the third device regions comprise a sub-region of the first conductivity type and a sub-region of the second conductivity type. The plurality of first regions and third regions are distributed on the second device region such that the third regions are not directly adjacent to each other. A fourth device region of the first conductivity type adjacent to the second device region and a fifth device region of the second conductivity type disposed within the fourth device region are also included. The first, second, third fourth and fifth regions are all disposed within the ESD region, and first device regions, the sub-regions of the first conductivity type of the third device region, the second device region, the fourth device region and the fifth device region form a silicon controlled rectifier (SCR).

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a silicon controlled rectifier (SCR) ESD structure. The invention may also be applied, however, to other semiconductor structures.

Figure 1A:
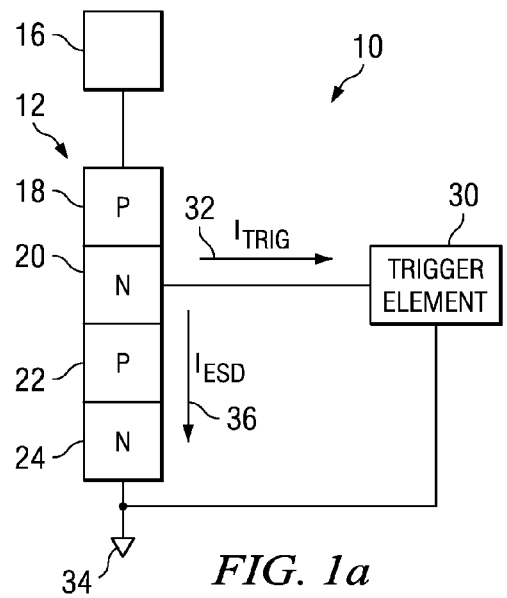
FIGS. 1a-1c are circuit diagrams of an embodiment of the present invention.

FIG. 1a illustrates a known ESD protection device 10. This circuit includes an SCR 12 that includes a p-type anode 18, an n-type cathode 24, an n-type n-base SCR region 20, and a p-type p-base SCR region 22. The anode 18 and a trigger element 30 are coupled to a node to be protected 16 and a reference node 34, which is typically ground. The trigger element 30 causes a trigger current $I_{TRIG}$ 32 to flow whenever the voltage at node 16 exceeds a certain threshold. Typical required trigger thresholds are between 1V and 20V. The presence of a trigger current $I_{TRIG}$ 32 causes the SCR to conduct a large current, $I_{ESD}$ 36.

Figure 1B:
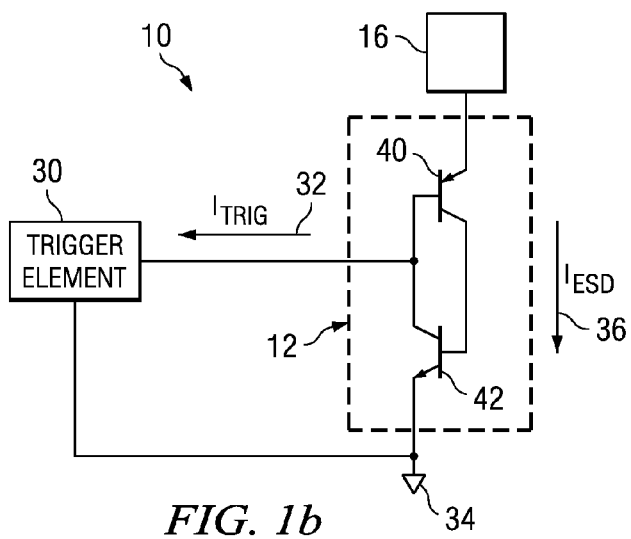

FIG. 1b is an equivalent circuit representation of ESD protection device 10 in a non-conducting state where the voltage at node 16 is less than the threshold of the trigger device, and the SCR is not conducting a large current $I_{ESD}$ 36. In the non-conducting state, the SCR can be modeled as a bipolar latch 12 that includes bipolar junction transistor (BJT) PNP device 40, and a BJT NPN device 42. The representative PNP device is made up of the p-type anode 18 as the emitter, the n-base region 20 as the base, and p-base region 22 as the collector. The representative NPN device is made up of n-base region 20 as the collector, the p-base region 22 as the base, and the n-type cathode 24 as the emitter. When trigger current $I_{TRIG}$ 32 flows from the base of representative PNP 40 in response to a voltage transient at node 16, the collector of the representative PNP 40 is pulled high, which turns on NPN 42, which pulls the base of PNP 40 down toward the potential at reference node 34, thereby latching the bipolar latch 18 and causing a large current $I_{ESD}$ 36 to flow.

Figure 1C:
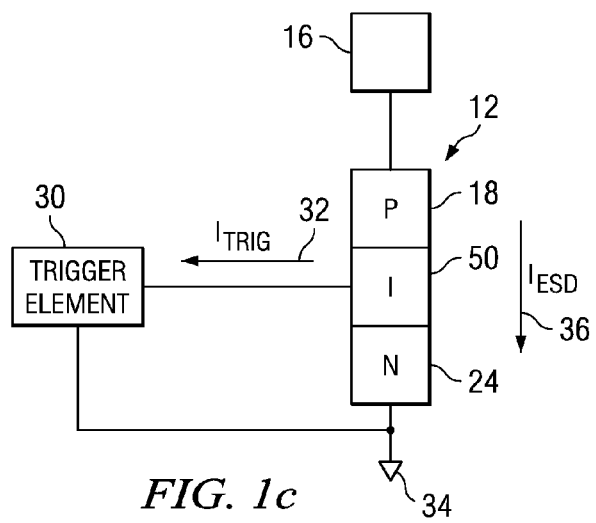

Turning to FIG. 1c, once the SCR 12 is latched, the SCR can be modeled as a forward biased PIN diode where the intrinsic region 50 includes the n-base region 20 and the p-base region 22. When the SCR 12 is turned on $I_{ESD}$ 36 will continue to flow even if $I_{TRIG}$ 32 is no longer applied. An SCR fabricated in a submicron process will typically conduct 10 mA to 100 mA per μm width. The SCR will stop conduction once $I_{ESD}$ 36 falls below a holding current, typically 1 μA to 11 mA of per μm width.

Figure 2A:
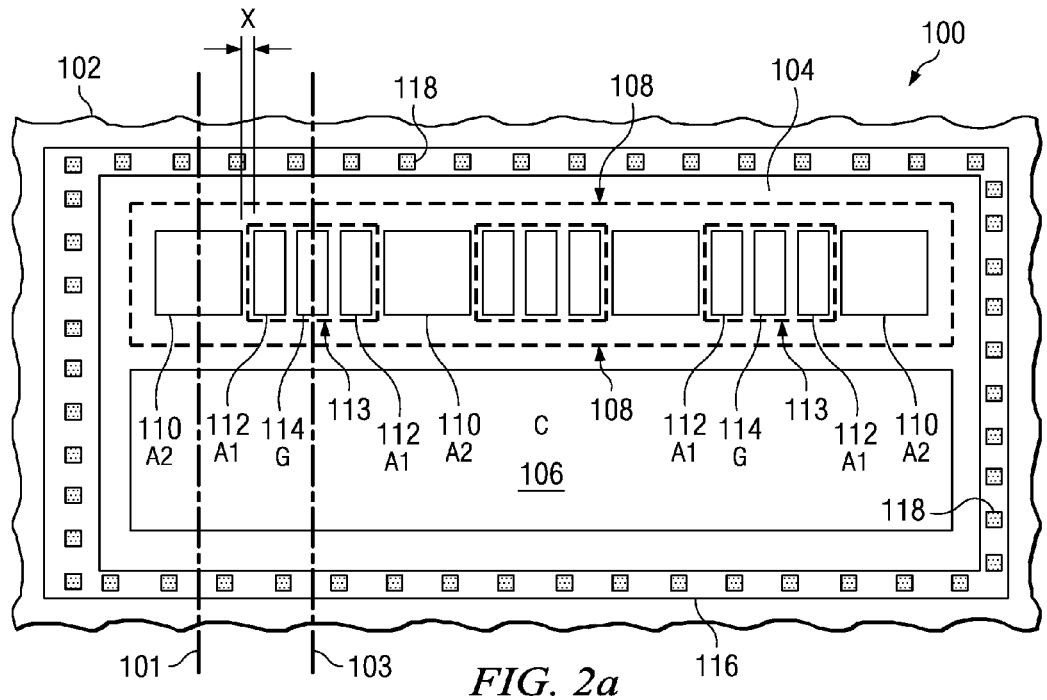
FIGS. 2a-2d illustrate a layout view, corresponding circuit model and cross sections of a 1-dimensional embodiment of the present invention.

FIG. 2a illustrates a layout view of an SCR 100 of an embodiment of the present invention, a 1-dimensional ESD device that can be used to protect a positive voltage transient on a node coupled to its anode. The anode is formed by p+ regions 110 and 112, the n-base region is formed by n-well 108, the p-base region is formed by p-well 104, and the cathode is formed by n+ region 106. An optional substrate ring formed by p+ region 116 surrounds the active portion of SCR 100. Anode regions 110 and 112, are spaced apart from each other by distance x, which is preferably sized to the minimum allowable spacing, for example 100 nm in an embodiment process. Keeping distance x at a short distance is preferable because it improves coupling within ESD device 100. Also included are trigger contact regions formed by n+ regions 114. Anode regions 112 and trigger contact regions 114 form triggered anode units 1 13. In alternative embodiments of the present invention, other types of regions can be used for the device regions specified hereinabove. Furthermore, non-minimum spacing between anode regions 110 and 112 can also be used depending on the particular application semiconductor process technology.

Anodes 110 and 112, trigger contacts 114, cathode 106 and optional substrate ring 116 preferably have contacts on the upper surface of these regions. Only the contacts 118 on the optional substrate ring are shown for clarity, however, it should be noted all of these regions have contacts. In preferred embodiments of the present invention, contacts to anode regions 110 and 112 are coupled to a node to be protected, cathode region 106 is coupled to ground, and trigger contact regions 114 are coupled to a trigger device. For the sake of clarity of explanation herein, anode region 112 has further been labeled A1, anode region 110 is labeled A2, trigger contact region 114 is labeled G and cathode region 106 is labeled C.

Figure 2B:
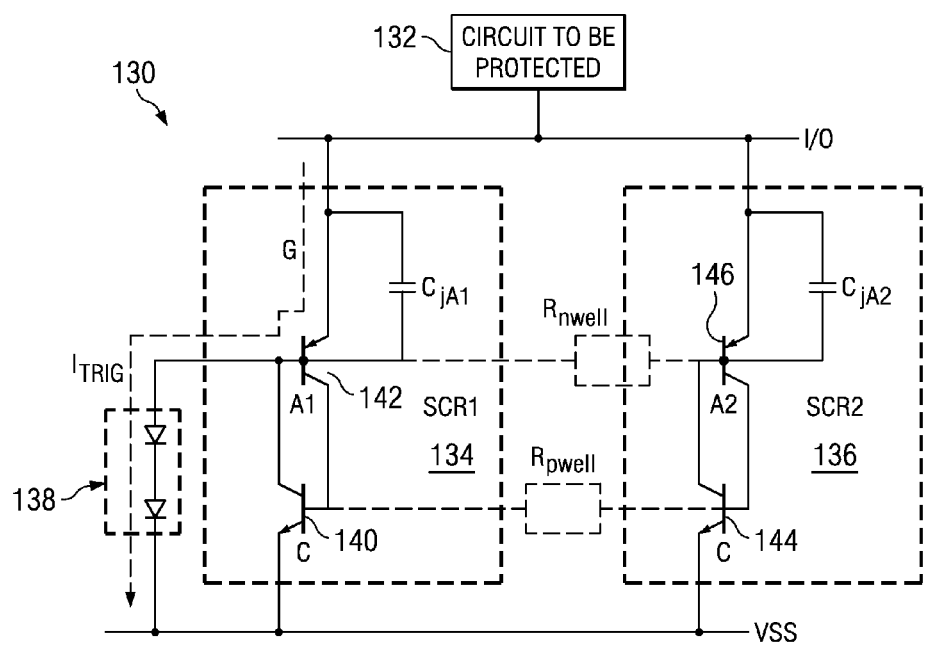

Turning to FIG. 2b, a circuit model 130 of the ESD device of FIG. 2a is shown. Bipolar latch 134 is representative of a local SCR (SCR1) formed by one of triggered anode units 113 (FIG. 2a). Node A1 at the emitter of PNP 142 corresponds to anode regions 112 (FIG. 2a), node G at the base of PNP 142 corresponds to the trigger region 114 (FIG. 2a), and node C at the emitter of NPN 140 corresponds with cathode region 106 (FIG. 2a). In preferred embodiments of the present invention, trigger 138 preferably resides on the same integrated circuit as ESD device 100 (FIG. 2a). Trigger 138 can be made from a diode, a plurality of series connected diodes, a transistor, or any other suitable component capable of generating trigger current, $I_{TRIG}$, during an ESD event. For example, two series connected n-well diodes may be used to form trigger 138. If two series connected diodes are used, Bipolar latch 142 will trigger when the potential difference between node I/O and VSS is about 3 VBE's, or between about 1.8V and about 10V, or even higher depending on the particular characteristics of the components, such as trigger element 30, and the semiconductor process being used.

Bipolar latch 136, on the other hand, is representative of a local SCR (SCR2) formed by one of the non-triggered anode regions 110 (FIG. 2a). Node A2 at the emitter of PNP 146 corresponds with anode regions 110 (FIG. 2a) and node C at the emitter of NPN 144 corresponds with cathode region 106 (FIG. 2a). Rather than being triggered by an adjacent trigger contact region 114 as is bipolar latch 134, Bipolar latch 136 is triggered by currents within n-well 108 (FIG. 2a) that are generated by trigger device 138 and currents from other anode regions 112 and 110 flowing into n-well 108 as the ESD device 100 (FIG. 2a) begins to conduct during an ESD event.

The speed at which ESD device 130 can respond to an ESD event at node I/O depends primarily on the RC time constant formed by $C_{jA1}$, $R_{pwell}$ and $R_{nwell}$. $C_{jA1}$ represents the capacitance between the p+ region of anode 112 and n-well region of n-base region 108, $R_{pwell}$ represents the resistance of p-well region 104 between n-well 108 and n+cathode region 106, and $R_{nwell}$ represents the resistance of n-well region 108. During normal, non-ESD operation, the capacitance seen by node I/O is relatively low because trigger device 138 and the base-emitter junction of PNP 142 are not conducting current. As node I/O increases in voltage however, trigger device starts to conduct current, thereby lowering its own impedance and forcing the base-emitter junction of PNP 142 to conduct current and become more forward biased. As the base-emitter junction of PNP 142 becomes more forward biased, the junction's diffusion capacitance significantly increases causing $C_{jA1}$ to increase.

In preferred embodiments of the present invention, two different types of SCR's are coupled together within the same ESD device. The first type of device as represented by SCR1 contains trigger regions 114 with adjacent anode regions 112 (FIG. 2a). The second type of device represented by SCR2 contains anode regions 110. Anode A1 of SCR1 preferably has the smallest possible area in order to minimize the capacitance between p+ region 112 and n-well 108. The area of anode A2 of SCR2, on the other hand, is larger to handle more ESD current.

As the ESD device begins to turn on, capacitance $C_{jA1}$ at anode A1 of SCR1 becomes the dominant contributor to the capacitance at node I/O. Because SCR2 is spaced further away from trigger regions 114 than SCR2, capacitance $C_{jA2}$ remains small when the ESD device initially turns on. Because of its small physical size, capacitance $C_{jA1}$ at SCR1 is lower than the capacitance of conventional SCR ESD devices. Under fast CDM conditions, the ESD pulse triggers SCR1 first and consecutively triggers SCR2.

Dividing the SCR into regions SCR1 and SCR2 allows minimizing the capacitance of the initially triggered part of the overall SCR, and therefore improves the response time of the entire device during the triggering event while maintaining a high overall level of ESD robustness and a high overall current handling capability.

Trigger tap regions 114 (also labeled as G) are preferably split into a small number of smallest possible size trigger tap regions. In conventional SCR devices, only one or two filaments of current are present in the device during triggering. By splitting the trigger tap regions, more current filaments can be present during device triggering. In some embodiments of the present invention, there can be as many current filaments are there are A1 anode regions 112. By having more filaments of current present in the device during triggering, the triggering resistance in embodiment SCR devices can be lower than the triggering resistance of SCR devices made according conventional embodiments.

Embodiments of the present invention are advantageous over the conventional embodiments, because in conventional SCR based ESD devices that use only a single SCR, or multiple SCR's that each comprise a trigger region, the turn-on capacitance is a strong function of ESD device size and current handling capacity. For conventional devices, the increase in turn-on capacitance at node I/O increases in voltage is a major contributing factor in slower turn-on times.

Figure 2C:
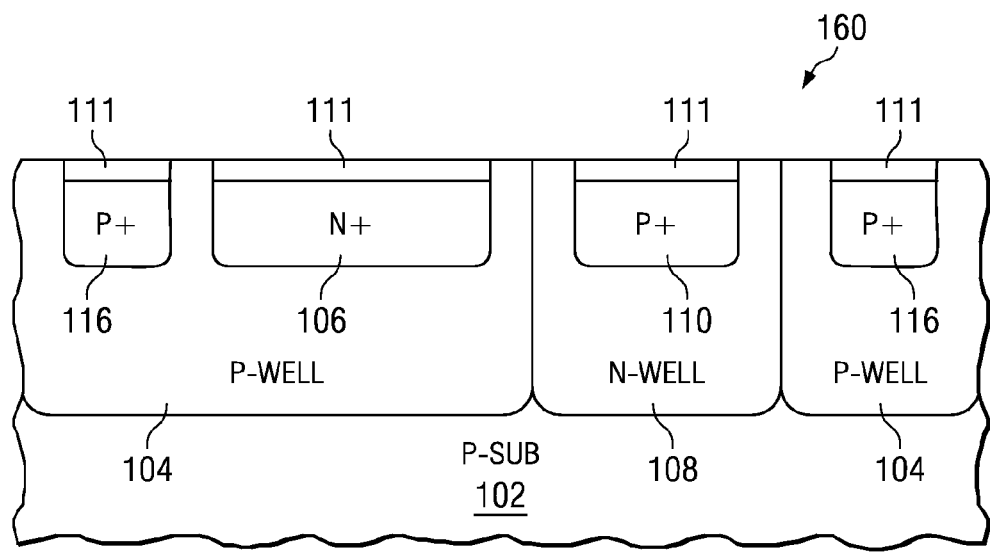
Figure 2D:
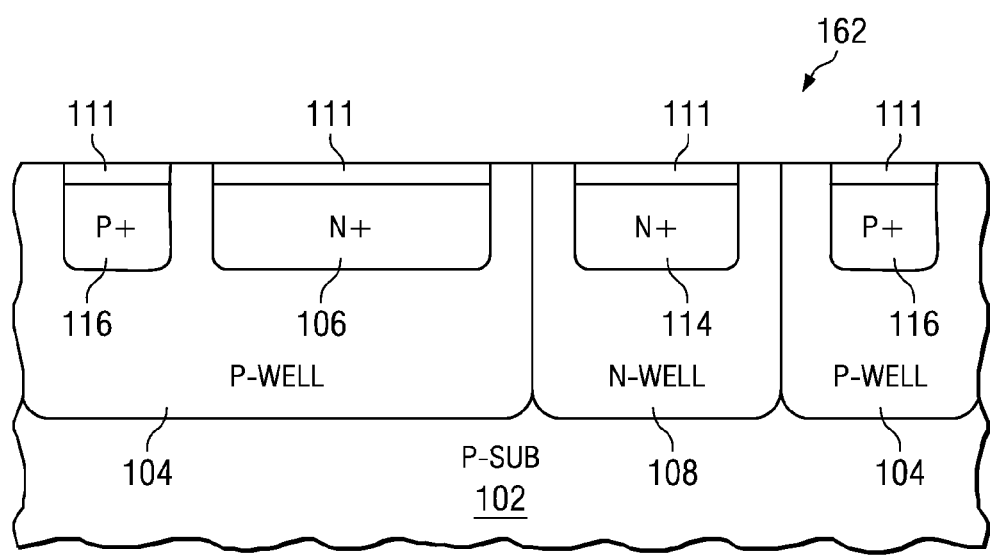

FIG. 2c illustrates cross section 160 of ESD device 100 taken at line 101 (FIG. 2a). N+ cathode region 106 and optional p+ substrate ring 116 are shown disposed in p-wells 104, and p+ anode 110 is shown disposed in n-well 108. In the depicted embodiment, p-wells 104 and n-well 108 reside in p-type substrate 102, however, in alternative embodiments of the present invention, other types of substrates, such as n-type, SOI and EPI, can be used, for example. FIG. 2d, on the other hand, illustrates a cross section 160 of ESD device 100 taken at line 103 (FIG. 2a). N+ cathode region 106 and optional p+ substrate ring 116 are shown disposed in p-wells 104, and n+ trigger region 114 is shown disposed in n-well 108.

N-type cathode region 106 and trigger region 114 are preferably made from an n-type source/drain implant. Typically, the cathode region 106 and trigger region 114 have the same doping because the cathode region 106 and trigger region 114 can be implanted at the same mask and processing step. For example, typically Arsenic ions can be implanted with a dose of about $1\times10^{14}$ cm$^{-2}$ to about $5\times10^{21}$ cm$^{-2}$ and an implant energy between about 10 keV and about 50 keV. In other embodiments, other materials, such as Phosphorus or Germanium, can be implanted. The resulting doping concentration for these n-type regions is typically greater than $10^{21}$ cm$^{-3}$.

The p-type anode 110 and 112 and optional substrate ring 116 are preferably made from a p-type source/drain implant. For example, boron ions can be implanted with a dose of about $5\times10^3$ cm$^{-2}$ to about $5\times10^{21}$ cm$^{-2}$ and an implant energy between about 5 keV and about 50 keV. In other embodiments, other materials, such as BF$_2$, can be implanted. The final doping concentration for these p-type regions is typically greater than $10^{21}$ cm$^{-3}$. Again, these p-type regions are preferably implanted at the same mask step. Alternatively, these regions may be implanted during different mask steps.

A portion of the top surface of anode regions 110 and 112, cathode region 106 and optional substrate ring 104 include silicided regions 111 on top of which contacts (not shown) are fabricated. These silicided regions are fabricated using conventional techniques.

In preferred embodiments, p-wells 104 and n-wells 108 are first fabricated in a p-type substrate 102 of a semiconductor wafer. N-type cathode region 106, n-type trigger region 114, and p-type anode 110 and 112 and p-type optional substrate ring 116 are then fabricated within these wells as shown in FIGS. 2c-2d. Silicide 111 is formed on the surface of N-type cathode region 106 n-type trigger region 114, and p-type anode 110 and 112 and p-type optional substrate ring 116, and contacts (not shown) are then coupled to silicide layers 111. Semiconductor processing continues with the application of metallization and dielectric layers until processing is complete. Alternatively, other processing steps and sequences may me used.

Figure 3A:
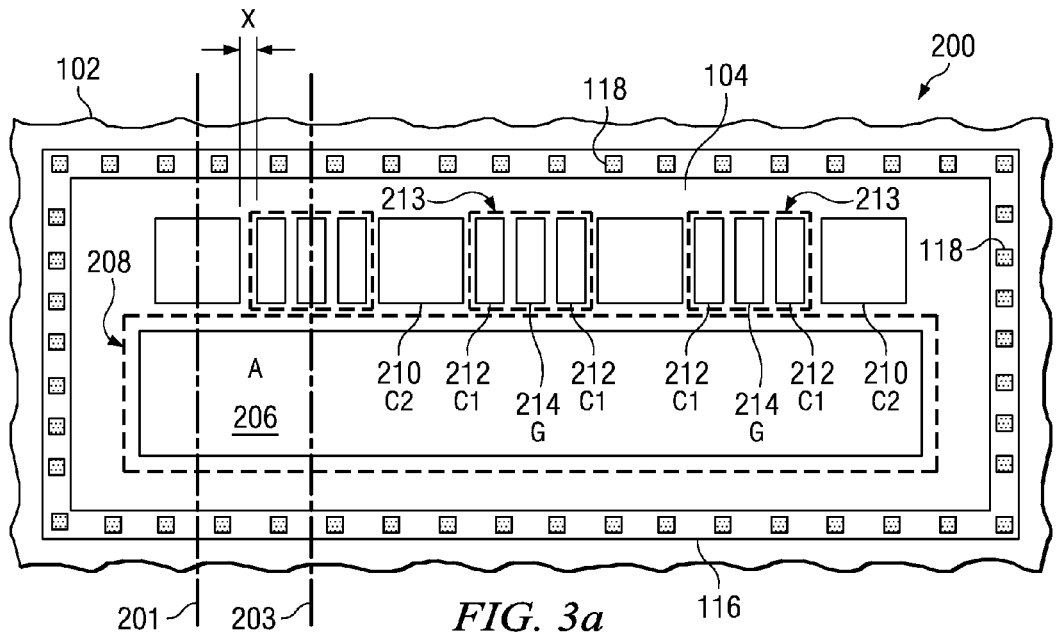
FIGS. 3a-3d illustrate a layout view, corresponding circuit model and cross sections of a complimentary 1-dimensional embodiment of the present invention.

Turning to FIG. 3a, a complimentary layout 200 of a 1-dimensional speed-optimized ESD device is shown which can be used to protect a node coupled to its cathode from a negative voltage transient. In complementary layout 200, the SCR is divided into multiple SCR devices by breaking up the cathode regions into multiple sections in a manner analogous to how the anode is divided in the embodiment of FIG. 2a. The cathode is formed by n+ regions 210 and 212, the p-base region is formed by p-well 104, the n-base region is formed by n-well 208, and the anode is formed by p+ region 206. An optional substrate ring formed by p+ region 116 surrounds the active portion of SCR 200. As was done with the anode regions in FIG. 2a, cathode regions 210 and 212, are spaced apart from each other by distance x, which is preferably sized to the minimum allowable spacing, for example 100 nm in an embodiment process. Again as with the embodiment of FIG. 2a, keeping distance x to a short distance is preferable because it improves coupling within ESD device 200. Also included are trigger contact regions formed by p+ regions 214. Anode regions 212 and trigger contact regions 214 form triggered anode units 213. In alternative embodiments of the present invention, other types of regions can be used for the device regions specified hereinabove. Furthermore, non-minimum spacing between cathode regions 210 and 212 can also be used depending on the particular application's semiconductor process technology. In the depicted embodiments, ESD device 200 resides in a p-type substrate 102, however, in alternative embodiments of the present invention, other types of substrates, such as SOI, EPI, or n-type can be used.

Figure 3B:
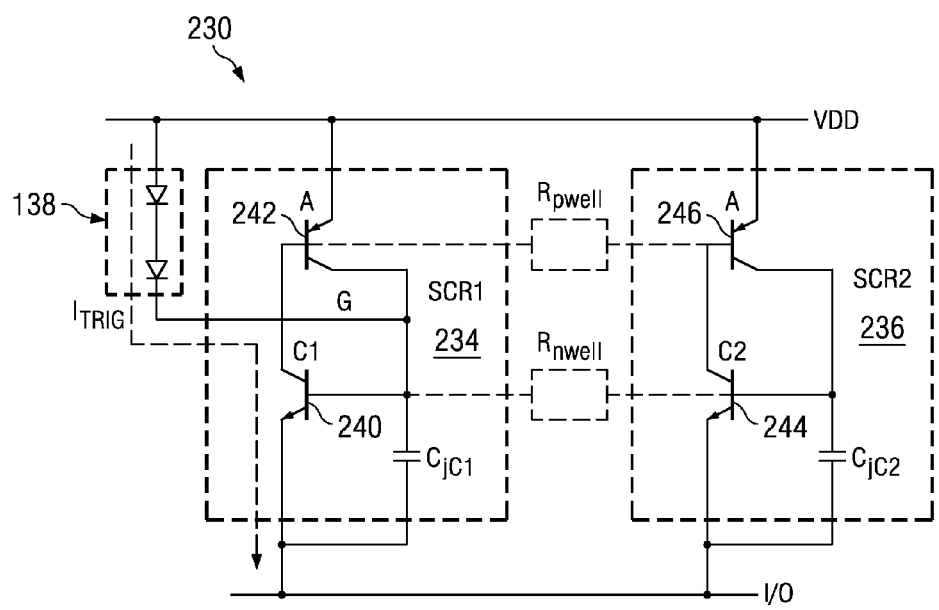

FIG. 3b shows an equivalent circuit representation 230 of 1-dimensional complementary ESD device 200 (FIG. 3a). Similar to the model in FIG. 3a, SCR1 and SCR2 are represented by two bipolar latches 234 and 236. In the complementary embodiment, however, anode node A is coupled to VDD and cathode node C is coupled to node I/O, which is typically coupled to a circuit to be protected (not shown). In the complementary embodiment, however, trigger device 138, whose functionality and architecture is described hereinabove, is coupled between VDD and n-base region 104 (FIG. 3a). In alternative embodiments, however, trigger device may be coupled to different nodes within the integrated circuit; for example, a dedicated ESD supply node may be used instead of VDD.

In the complementary 1-dimensional embodiment, bipolar latch 234 is representative of a local SCR (SCR1) formed by one of triggered cathode units 213 (FIG. 3a). Node C1 at the emitter of NPN 240 corresponds to cathode regions 212 (FIG. 3a), node G at the base of NPN 240 corresponds to the trigger region 214 (FIG. 3a), and node A at the emitter of PNP 242 corresponds with anode region 206 (FIG. 3a).

Bipolar latch 236, on the other hand, is representative of a local SCR (SCR2) formed by one of the non-triggered cathode regions 210 (FIG. 3a). Node C2 at the emitter of NPN 244 corresponds with cathode regions 210 (FIG. 3a) and node A at the emitter of PNP 246 corresponds with anode region 206 (FIG. 3a). During triggering, bipolar latch 236 is triggered by currents within p-well 104 (FIG. 3a) that are generated by trigger device 138 and currents from other cathode regions 212 and 210 flowing into p-well 104 as the ESD device 200 (FIG. 3a) begins to conduct during an ESD event.

Triggering of complementary 1-dimensional ESD device 200 (FIG. 3a) functions similarly to the triggering of the non-complementary ESD Device 100 (FIG. 2a), except that in the complementary layout, the base-emitter capacitance $C_{jC1}$ of NPN 240 formed by the junction between n+ cathode region 212 (FIG. 3a) and p-well p-base region 104 is the dominant capacitance during turn-on rather than $C_{jA1}$. In complementary layout embodiments, the RC time constant of the ESD device during activation is dominated by $C_{jC1}$, $R_{pwell}$ and $R_{nwell}$.

Figure 3C:
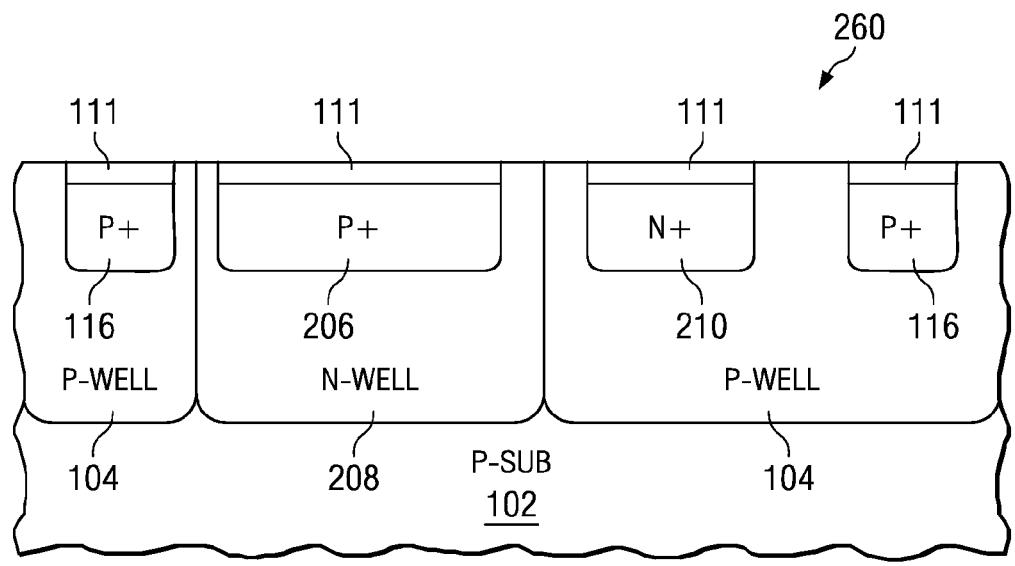
Figure 3D:
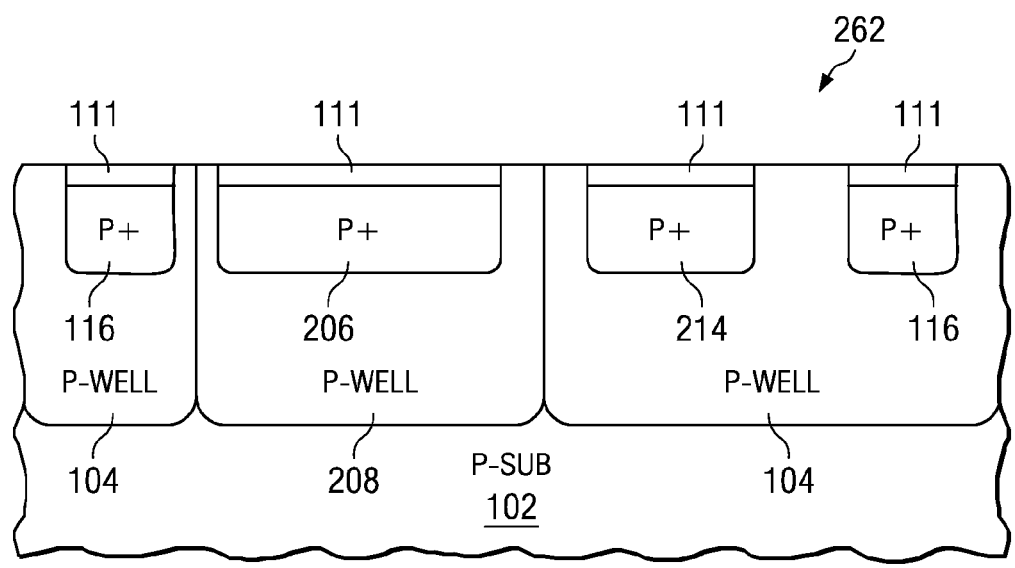

FIG. 3c illustrates a cross section 260 of ESD device 200 taken at line 201 (FIG. 3a). N+ cathode region 210 and optional p+ substrate ring 116 are shown disposed in p-wells 104, and p+ anode 206 is shown disposed in n-well 208. In the depicted embodiment, p-wells 104 and n-well 208 reside in p-type substrate 102, however, in alternative embodiments of the present invention, other types of substrates, such as SOI, EPI, or n-type can be used. FIG. 3d, on the other hand, illustrates a cross section 262 of ESD device 200 taken at line 203 (FIG. 3a). FIG. 3d is similar to FIG. 3c, with the exception that p+trigger region 214 is shown disposed in p-well 104. Silicide regions 111 and contacts (now shown) are provided as described hereinabove with respect to FIGS. 2c and 2d. Processing of device 200 (FIG. 3a) also proceeds as described hereinabove with respect to FIGS. 2a-2d using similar implants and mask steps for p+ and n+ regions.

The embodiments shown in FIGS. 2a and 3a are 1-dimensional speed-optimized devices suitable for both human body model (HBM) pulses lasting about 200 ns as well as CDM pulses lasting only about 1 ns to about 5 ns. These embodiments are also suitable to address the requirements of machine model (MM) ESD protection. In other embodiments of the present invention, such as the embodiments shown in FIGS. 4a, 4d, and 5a, a 2-dimensional layout can be used.

Figure 4A:
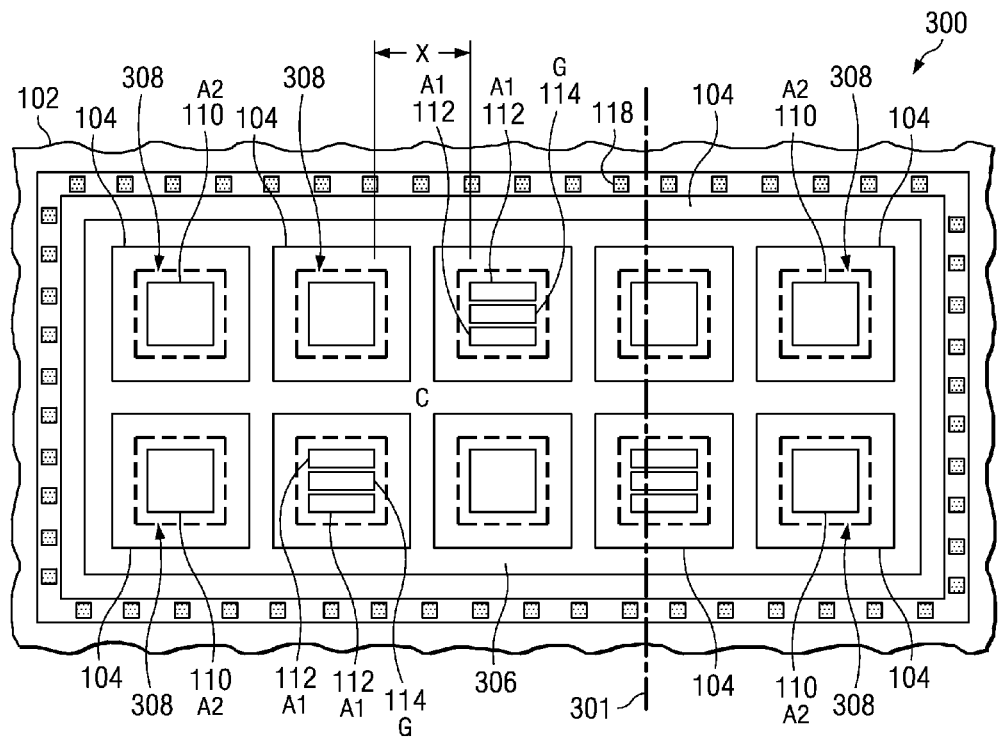
FIGS. 4a-4d illustrate a layout view, corresponding circuit model and cross sections of a 2-dimensional embodiment of the present invention.

Turning to FIG. 4a, 2-dimensional embodiment of the present invention is shown. N+ cathode region 306 is formed as a grid that surrounds triggered and non-triggered anode regions 110 and 112. Each anode region has a p-well p-base region 104 and an n-well n-base region 308. In alternative embodiments, however, these p-base and n-base regions may comprise other types of regions, for example substrate and EPI regions. In the triggered anode regions, p+ anode regions 112 reside in n-well n-base regions 308 along n+ trigger contact regions 114. It should be noted that n+ cathode region 306 is disposed above p-well region 104, thereby allowing coupling between anodes through p-well 104. As discussed hereinabove with respect to the embodiment of FIG. 2a, anode regions 112 and trigger regions 114 are preferably sized to a minimum geometry along at least one dimension and distance x between anode regions is preferably about 1 μm, although in alternative embodiments other dimensions may be used. In the non-triggered anode regions, p+ anode regions 110 reside in n-well n-base regions. Anode regions 110 are preferably sized larger than anode regions 112 in order to conduct higher currents.

Figure 4B:
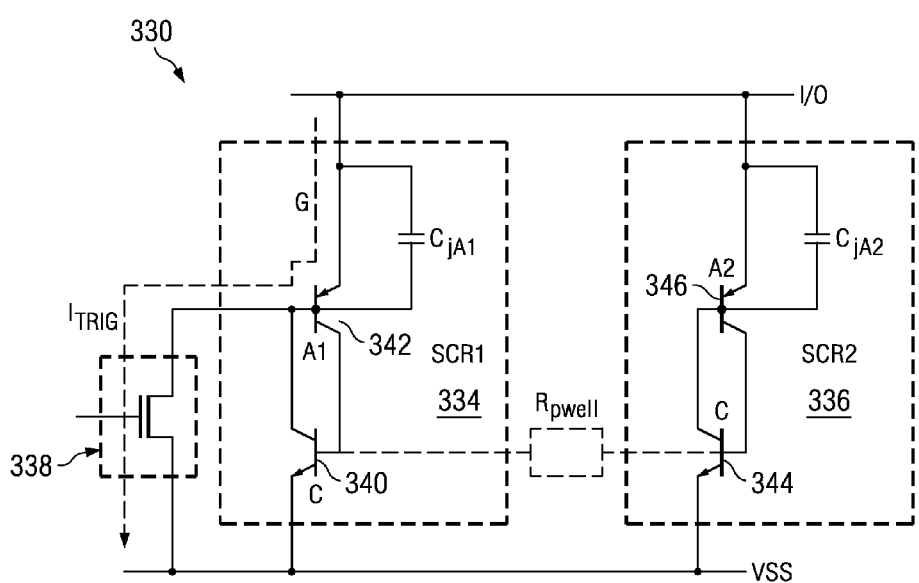

FIG. 4b shows a circuit model representation 330 of the 2-dimensional ESD structure 300 shown in FIG. 4a. Bipolar latch 334 represents triggered anode regions (designated as SCR1) and bipolar latch 336 represents non-triggered anode regions (designated as SCR2). Trigger device 338 is illustrated as an NMOS device in this embodiment, however, other trigger devices, such as diodes can be used as described hereinabove. It should be noted that in embodiments of the present invention, additional trigger circuitry, such as RC networks and inverter chains, may be coupled to the gate of NMOS device within trigger device 338. Turn-on operation of the 2-dimensional ESD device functions similarly to the ESD device of FIGS. 2a-2b, however, coupling between a triggered device (SCR1) and a non-triggered device (SCR2) includes current flowing underneath cathode 306 in p-well 104. Unlike the ESD device of FIGS. 2a-2b, however, n-well regions 308 (FIG. 4a) are decoupled.

In preferred embodiments of the present invention, the geometric distribution of triggered and non-triggered anode regions for 2-dimensional ESD structure is optimized to minimize turn-on time for a given current handling capability. To this end, a triggered anode region is preferably not situated along the length or width of a non-triggered anode region, as shown in FIG. 4a.

Figure 4C:
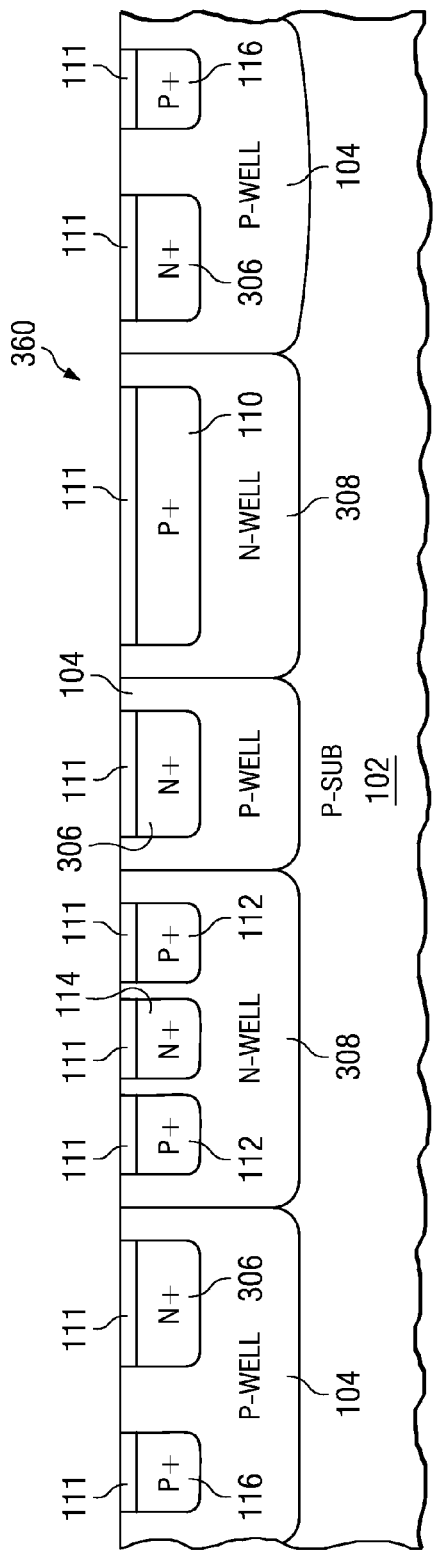

FIG. 4c illustrates cross section 360 of ESD device 300 taken at line 301 (FIG. 4a). N+ cathode regions 306 and optional p+ substrate ring 116 are shown disposed in p-wells 104, and p+ anodes 110 and 112 are shown disposed in n-well 308. In the depicted embodiment, p-wells 104 and n-well 308 reside in p-type substrate 102, however, in alternative embodiments of the present invention, other types of substrates, such as EPI, SOI, or n-type can be used. Silicide regions 111 and contacts (now shown) are provided as described hereinabove with respect to FIGS. 2c and 2d. Processing of device 300 (FIG. 4a) also proceeds as described hereinabove with respect to FIGS. 2a-2d using similar implants and mask steps for p+ and n+ regions.

Figure 4D:
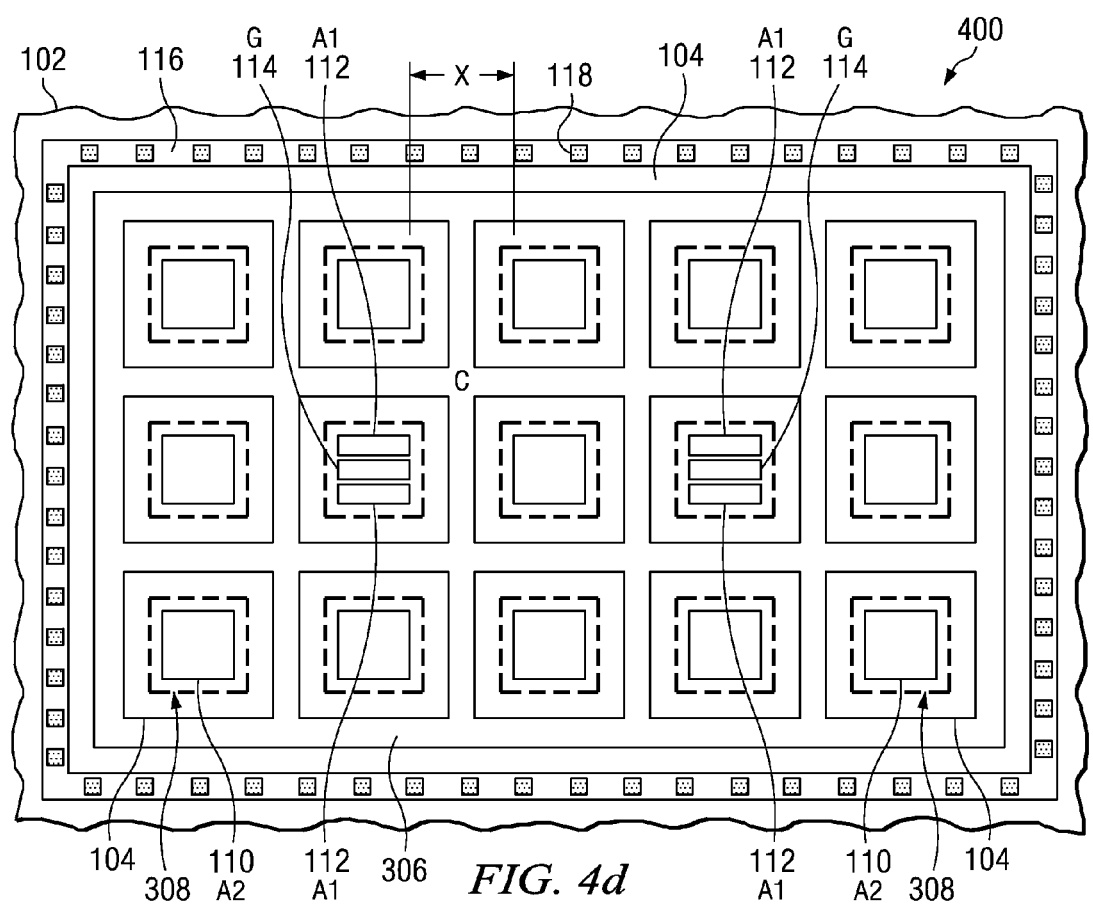

FIG. 4d shows an alternative embodiment layout of a 2-dimensional ESD structure 400. Instead of having three triggered anode regions and six non-triggered anode regions on a 2×5 grid as was shown in FIG. 4a, FIG. 4d shows only two triggered anode regions for 13 non-triggered anode regions on a 3×5 grid. The operation of ESD structure 400 functions in accordance with the embodiments shown in FIGS. 4a-4b and described hereinabove. ESD structure 400, however, may handle more current than ESD structure 300 (FIG. 4a) because of its increased number of anode regions, and have a different turn-on time characteristic from ESD structure 300 (FIG. 4a). It should be noted that in further alternative embodiments of the present invention, other two dimensional grid sizes, non-rectangular regions, and other ratios of triggered to non-triggered anode regions can be used.

Figure 5C:
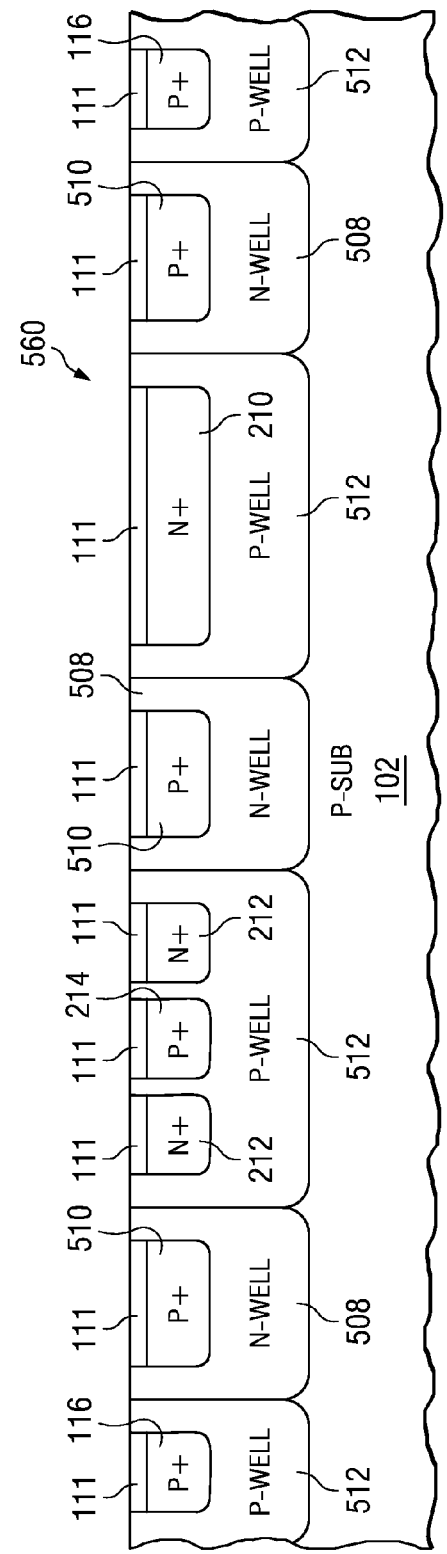
FIGS. 5a-5c illustrate a layout view, corresponding circuit model and cross sections of a complimentary 2-dimensional embodiment of the present invention.
Figure 5A:
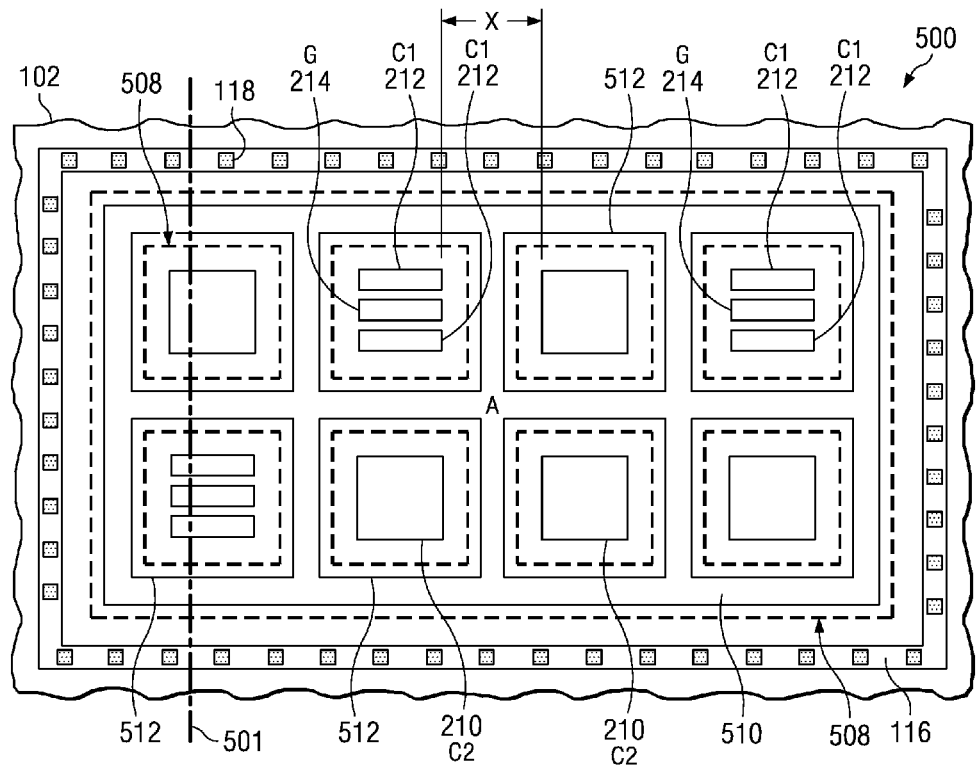

Turning to FIG. 5a, a complementary layout of a 2-dimensional ESD structure 500 is shown. In the 2-dimensional complementary embodiment of the present invention, p+ anode region 510 is formed as a grid that surrounds triggered and non-triggered cathode regions 210 and 212. Each cathode region has an n-well n-base region 508 and a p-well p-base region 512. In alternative embodiments, however, these p-base and n-base regions may comprise other types of regions, for example substrate and EPI regions. In the triggered cathode regions, n+ cathode regions 212 reside in p-well p-base regions 512 along a p+ trigger contact regions 214. It should be noted that p+ anode region 510 is disposed above n-well region 508, thereby allowing coupling between anodes though n-well 508. As discussed hereinabove with respect to the embodiment of FIG. 3a, cathode regions 212 and trigger regions 214 are preferably sized to a minimum geometry along at least one dimension and distance x between cathode regions is preferably about 1 µm, although in alternative embodiments other dimensions may be used. In the non-triggered cathode regions, n+ cathode regions 210 reside in p-well p-base regions 512. Cathode regions 210 are preferably sized larger than cathode regions 212 in order to conduct higher currents.

Figure 5B:
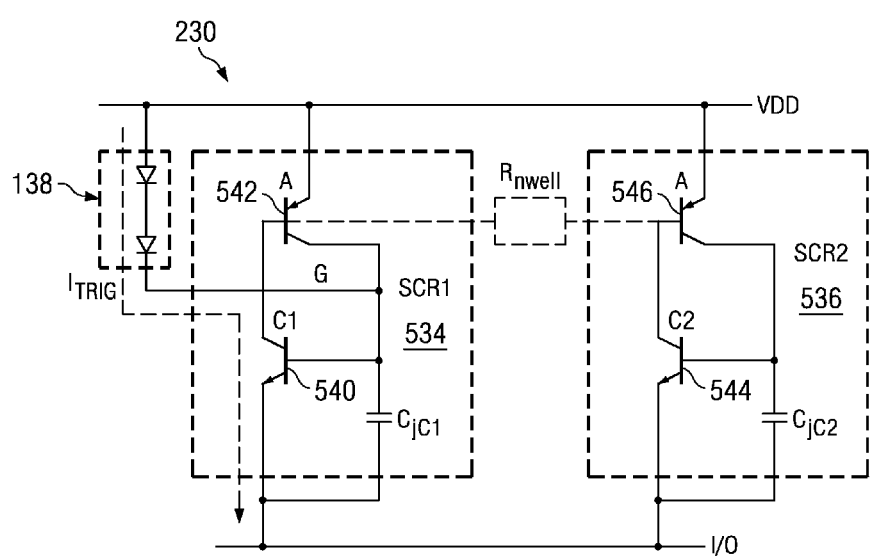

The embodiment of FIG. 5a functions in accordance to the circuit model shown in FIG. 5b. Triggered cathode regions 212 and its surrounding regions are modeled by bipolar latch 534 (SCR1) containing bipolar transistors 540 and 542, and non-triggered cathode regions 210 are modeled by bipolar latch 526 (SCR2) containing transistors 544 and 546. Coupling between triggered and non-triggered regions occur through n-well regions 508 that extend underneath anode regions 510. Trigger device 138 activates the ESD circuit as described hereinabove with respect to FIG. 3a.

FIG. 5c illustrates cross section 560 of ESD device 500 taken at line 501 (FIG. 5a). N+ cathode regions 306, p+ trigger contact regions 214 and optional p+ substrate ring 116 are shown disposed in p-wells 512, and p+ anodes 510 are shown disposed in n-well 508. In the depicted embodiment, p-wells 104 and n-well 308 reside in p-type substrate 102, however, in alternative embodiments of the present invention, other types of substrates, such as SOI, EPI, or n-type can be used. Silicide regions 111 and contacts (now shown) are provided as described hereinabove with respect to FIGS. 2c and 2d. Processing of device 400 (FIG. 5a) also proceeds as described hereinabove with respect to FIGS. 2a-2d using similar implants and mask steps for p+ and n+ regions.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   an ESD device region disposed within a semiconductor body;
   a plurality of first device regions of a first conductivity type disposed on a second device region of a second conductivity type, the second conductivity type opposite the first conductivity type, wherein the second device region is disposed within the ESD region;
   a plurality of third device regions disposed on the second device region, wherein
      the third device regions comprise a sub-region of the first conductivity type and a sub-region of the second conductivity type, and
      the plurality of first device regions and third device regions are distributed on the second device region such that third device regions are not directly adjacent to each other;
   a fourth device region of the first conductivity type adjacent to the second device region, the fourth device region disposed within the ESD region; and
   a fifth device region of the second conductivity type disposed within the fourth device region, wherein the first device regions, the sub-regions of the first conductivity type of the third device region, the second device region, the fourth device region and the fifth device region comprise a silicon controlled rectifier (SCR).

2. The semiconductor device of claim 1, further comprising a trigger device coupled to the sub-region of the second conductivity type.

3. The semiconductor device of claim 2, wherein the trigger device comprises a diode.

4. The semiconductor device of claim 2, wherein the trigger device comprises a plurality of diodes coupled in series.

5. The semiconductor device of claim 1, wherein
   the first conductivity type is p-type and the second conductivity type is n-type;
   the first device regions and the sub-regions of the first conductivity type comprises an anode; and
   the fifth device region comprises a cathode.

6. The semiconductor device of claim 5, wherein the second device region comprises an n-well.

7. The semiconductor device of claim 1, further comprising a substrate connection of the first conductivity type at a perimeter of the ESD device region.

8. The semiconductor device of claim 1, wherein
   the first conductivity type is n-type and the second conductivity type is p-type;
   the first device regions and the sub-regions of the first conductivity type comprises a cathode; and
   the fifth device region comprises an anode.

9. The semiconductor device of claim 8, wherein the fourth device region comprises an n-well.

10. The semiconductor device of claim 1, wherein
    a distance between adjacent first device regions is between about 10 mn and about 10 µm; and
    a distance between a first device region and an adjacent third device region is between about 10 nm and about 10 µm.

11. The semiconductor device of claim 1, wherein an area of each first device region is greater than an area of each sub-region of the first conductivity type in the second device region.

12. An ESD protection device comprising:
    a SCR structure comprising,
       a plurality of p-type first anode regions coupled to an n-type n-base region,
       a plurality of hybrid regions coupled to the n-type n-base region, the hybrid regions comprising a p-type second anode region and an n-type trigger region,
       a p-type p-base region coupled to the n-type n-base region, and
       an n-type cathode region coupled to the p-type b-base region, wherein the plurality of hybrid regions are sparsely distributed among the first anode regions; and
    a trigger device coupled to the n-type trigger region.

13. The ESD protection device of claim 12, wherein
    the p-type first anode region and p-type second anode regions comprise p+regions;
    the n-type n-base region comprises an n-well;
    the p-type p-base region comprises a p-well;
    the n-type cathode region comprises an n+ region; and
    the ESD protection device is fabricated on a semiconductor substrate.

14. The ESD protection device of claim 12, wherein the p-type anode region is coupled to a circuit to be protected.

15. An ESD protection device comprising:
    a plurality of first SCR devices, each of the plurality of first SCR devices comprising an anode, a cathode, a first intermediate node, and a second intermediate node;
    a plurality of second SCR devices, each of the plurality of second SCR devices comprising an anode, a cathode, a first intermediate node, and a second intermediate node, wherein the anodes of the plurality of first SCR devices are coupled to the anodes of the plurality of second SCR devices, the cathodes of the plurality of second SCR devices are coupled to the cathodes of the plurality of first SCR devices, the first intermediate nodes of the plurality of first SCR devices are resistively coupled to the first intermediate nodes of the plurality of second SCR devices, and the plurality of first SCR devices are sparsely distributed among the plurality of second SCR devices; and a trigger device coupled to the second intermediate nodes of the plurality of first SCR devices.

16. The ESD protection device of claim 15, further comprising a circuit coupled between the anodes and cathodes of the first and second SCR devices.

17. An ESD protection device comprising:
a first SCR device;
a second SCR device in parallel with the first SCR device, the first SCR device coupled to the second SCR device such that the triggering of the first SCR device causes the triggering of the second SCR device.

18. The device of claim 17, wherein the first SCR device is coupled to the second SCR device through an n-well or a p-well.

19. The device of claim 18, wherein the first SCR device is coupled to the second SCR through the n-well and the p-well.

20. The device of claim 17, further comprising a trigger element coupled to the first SCR device.

21. The device of claim 20, wherein the trigger element is coupled to an n-base region of the first SCR.

22. A semiconductor device comprising:
a first ESD sub-region within an ESD device region disposed on a semiconductor body, wherein the first ESD sub-region comprises:
a first device region of a first conductivity type disposed in a second device region of a second conductivity type, the second conductivity type opposite the first conductivity type, and
a third device region of the first conductivity type surrounding the second device region;
a second ESD sub-region within the ESD device region disposed on the semiconductor body, wherein the second ESD sub-region comprises:
a fourth device sub-region of the first conductivity type disposed in a fifth device region of the second conductivity type,
a sixth device sub-region of the second conductivity type disposed in the fifth device region, and
a seventh device region of the first conductivity type surrounding the second device region; and
an eighth device region of the second conductivity type adjacent to the third and seventh device regions, wherein the eighth device region, and the first and second ESD sub-regions form a silicon controlled rectifier (SCR) device.

23. The semiconductor device of claim 22, wherein:
the second and fifth device regions are directly adjacent to each other; and the third and seventh device regions are directly adjacent to each other.

24. The semiconductor device of claim 1, wherein:
the second device region comprises a contiguous device region; and
the fourth device region comprises a contiguous device region.

25. The semiconductor device of claim 1, wherein:
the second device region comprises a plurality of non-contiguous second device regions; and
the fourth device region comprises a plurality of non-contiguous fourth device regions.

26. The semiconductor device of claim 22, wherein:
the first ESD sub-region comprises a plurality of first ESD device sub-regions;
the second ESD sub-region comprises a plurality of second ESD device sub-regions;
the eighth device region comprises a grid of the second conductivity type adjacent to the third and seventh device regions surrounding each of the plurality and first and second device regions; and the plurality of first and second ESD sub-regions are distributed such that a second ESD sub-region does not directly border another second ESD sub-region along a length of a boundary.

27. The semiconductor device of claim 26, further comprising a trigger device coupled to the sixth device sub-region.

28. The semiconductor device of claim 26, wherein:
the first conductivity type is p-type and the second conductivity type is n-type;
the first device regions and the fourth device sub-regions of the first conductivity type comprises an anode; and
the grid comprises a cathode.

29. The semiconductor device of claim 28, wherein
a distance between adjacent first device regions is between about 10 nm and about 10 µm; and
a distance between a first device region and an adjacent fourth device sub-region is between about 100 nm and about 10 µm.

30. The semiconductor device of claim 28, wherein the second and fifth device regions comprise n-wells.

31. The semiconductor device of claim 26, wherein:
the first conductivity type is n-type and the second conductivity type is p-type;
the first device regions and the fourth device sub-regions of the first conductivity type comprises a cathode; and
the grid comprises an anode.

32. The semiconductor device of claim 31, wherein
a distance between adjacent first device regions is between about 10 nm and about 10 µm; and
a distance between a first device region and an adjacent fourth device sub-region is between about 10 nm and about 10 µm.

33. The semiconductor device of claim 31, wherein the third and seventh device regions comprise n-wells.

34. The semiconductor device of claim 31, wherein the first device region comprises a greater area than the fourth device sub-region.

* * * * *